(12) United States Patent
Lee

(10) Patent No.: US 9,773,882 B1
(45) Date of Patent: Sep. 26, 2017

(54) INTEGRATED STRUCTURES

(71) Applicant: Micron Technology, Inc., Boise, ID (US)

(72) Inventor: Changhyun Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/405,141

(22) Filed: Jan. 12, 2017

(51) Int. Cl.
| | |
|---|---|
| H01L 27/148 | (2006.01) |
| H01L 29/80 | (2006.01) |
| H01L 29/76 | (2006.01) |
| H01L 21/00 | (2006.01) |
| H01L 29/51 | (2006.01) |
| H01L 27/11556 | (2017.01) |
| H01L 27/11582 | (2017.01) |

(52) U.S. Cl.
CPC ...... *H01L 29/512* (2013.01); *H01L 27/11556* (2013.01); *H01L 27/11582* (2013.01)

(58) Field of Classification Search
CPC ......... H01L 27/11529; H01L 27/11524; H01L 27/1157; H01L 27/11514; H01L 27/11521; H01L 27/11568; H01L 27/11578; H01L 27/11597; H01L 27/1159; H01L 27/2454; H01L 2924/1438; H01L 2224/48145; H01L 29/66825; H01L 29/66833; H01L 29/66666; H01L 29/7827; H01L 25/0657; H01L 21/8221; G06F 2212/2022

USPC ........ 257/220, 263, 328, 330, 331; 438/156, 438/173, 192, 212, 268
See application file for complete search history.

(56) References Cited

U.S. PATENT DOCUMENTS

| 8,946,807 B2 | 2/2015 | Hopkins et al. |
| 9,184,175 B2 | 11/2015 | Dennison et al. |
| 2016/0293623 A1 * | 10/2016 | Simsek-Ege ...... H01L 27/11582 |

OTHER PUBLICATIONS

U.S. Appl. No. 14/679,926, filed Apr. 6, 2015 by Simsek-Ege et al.

* cited by examiner

*Primary Examiner* — Hsien Ming Lee
(74) *Attorney, Agent, or Firm* — Wells St. John P.S.

(57) ABSTRACT

Some embodiments include an integrated structure having a vertical stack of alternating insulative levels and conductive levels. Recesses extend into the conductive levels. The conductive levels have projections above and below the recesses. The projections have outer edges. An outer periphery of an individual conductive level is defined by a straight-line boundary extending from the outer edge of the projection above the recess in the individual conductive level to the outer edge of the projection below the recess in the individual conductive level. A depth of the recess is defined as a horizontal distance from the straight-line boundary to an innermost periphery of the recess. The recesses have depths of at least about 5 nm. Charge-blocking regions extend within the recesses. Charge-storage structures are along the charge-blocking regions. Gate dielectric material is along the charge-storage structures. Channel material is along the gate dielectric material.

33 Claims, 9 Drawing Sheets

INTEGRATED STRUCTURES

TECHNICAL FIELD

Integrated structures; such as three-dimensional NAND memory arrays having recessed control gate levels.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

DETAILED DESCRIPTION OF THE ILLUSTRATED EMBODIMENTS

It is desired to have good electrical coupling between a charge-storage structure (e.g., a floating gate) of vertical NAND and the control gates of the vertical NAND. Some embodiments include structures which have deep recesses (i.e., recesses deeper than about 5 nanometers (nm)) extending into control gate levels, and which have charge-blocking material extending into the deep recesses. Charge-storage structures are spaced from the control gate levels by the charge-blocking material, and have good electrical coupling with the control gate levels as a result of geometry imposed by the deep recesses. The control gate levels may comprise conductive lines of a single material; or may comprise two or more different conductive materials. If the control gate levels comprise two or more different conductive materials, the recesses may extend into or through one of the conductive materials. Example embodiments are described with reference to FIGS. 1-14.

Figure 1:
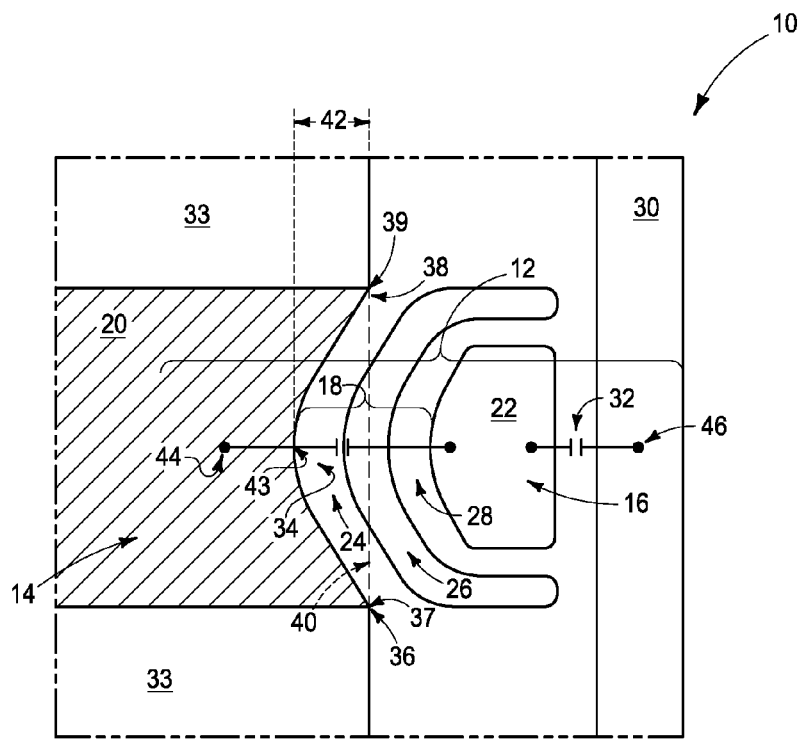
FIG. 1 is a diagrammatic cross-sectional side view of an example memory cell.

Referring to FIG. 1, a construction 10 comprises an example memory cell 12. The memory cell 12 includes a control gate 14, a charge-storage structure 16, and a charge-blocking region 18 between the control gate 14 and the charge-storage structure 16.

The control gate 14 comprises conductive material 20. Such conductive material may comprise any suitable composition or combination of compositions; such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The charge-storage structure 16 comprises charge-storage material 22. The charge-storage material 22 may comprise any suitable composition or combination of compositions; and in some embodiments may comprise floating gate material (for instance, doped or undoped silicon) or charge-trapping material (for instance, silicon nitride, metal dots, etc.).

The charge-blocking region 18 may comprise any suitable material or combination of materials. In the illustrated embodiment, the charge-blocking region comprises three materials 24, 26 and 28. The materials 24 and 28 are a same composition as one another in the shown embodiment, and accordingly merge together. In other embodiments, the materials 24 and 28 may be different compositions relative to one another. In the illustrated embodiment, the materials 24 and 28 may both comprise, consist essentially of, or consist of silicon dioxide.

The material 26 is sandwiched between the materials 24 and 28. The material 26 may comprise any suitable composition or combination of compositions; and in some embodiments may comprise, consist essentially of, or consist of silicon nitride.

The materials 24, 26 and 28 are shown to all be about the same thickness as one another. In other embodiments, at least one of the materials 24, 26 and 28 may have a substantially different thickness than at least one other of the materials 24, 26 and 28.

The charge-storage structure 16 is along a channel material 30, and is spaced from such channel material by gate dielectric material 32.

The channel material 30 may comprise any suitable composition or combination of compositions; and in some embodiments may comprise, consist essentially of, or consist of appropriately-doped semiconductor material (such as, for example, appropriately-doped silicon).

The gate dielectric material 32 may comprise any suitable composition or combination of compositions; and in the shown embodiment comprises a same composition as the materials 24 and 28 of the charge-blocking region 18—and accordingly merges with the materials 24 and 28. For instance, all of the materials 24, 28 and 32 may comprise, consist essentially of, or consist of silicon dioxide. In some embodiments the gate dielectric material 32 may be a different composition relative to one or both of the materials 24 and 28 of the charge-blocking region 18.

The control gate 14, charge-blocking region 18, charge-storage structure 16, gate dielectric material 32 and channel material 30 are together comprised by the memory cell 12. In the illustrated embodiment, insulative material 33 is provided above and below the control gate material 20. Such insulative material may comprise any suitable composition or combination of compositions; and in some embodiments may comprise, consist essentially of, or consist of silicon dioxide.

The illustrated memory cell 12 may be one of a plurality of vertically-stacked memory cells, as described in more detail below with reference to FIGS. 3-8. In some embodiments, the memory cell 12 may be one of a plurality of substantially identical memory cells incorporated into a NAND memory array (with the term "substantially identical" meaning identical to within reasonable tolerances of fabrication and measurement).

A recess 34 extends into the control gate material 20. The control gate material 20 has a first projection 36 beneath the recess 34, and a second projection 38 above the recess 34 in the illustrated cross-section of FIG. 1. The projections 36 and 38 have outer edges 37 and 39, respectively. A straight-line boundary 40 may be defined to extend from the outer edge 37 to the outer edge 39; and a depth of the recess may be defined to be a horizontal distance 42 from the straight-line boundary 40 to innermost periphery 43 of the recess 34 (with the innermost periphery 43 being an innermost region of a surface of control gate material 20 along the recess 34). In some embodiments, the depth 42 may be at least about 5 nanometers (nm), at least about 6 nm, at least about 8 nm, at least about 10 nm, etc. In some embodiments the depth 42 may be within a range of from about 5 nm to about 20 nm; within a range of from about 5 nm to about 15 nm; within a range of from about 6 nm to about 20 nm, etc.

The charge blocking region 18 extends into the recess 34. In the illustrated embodiment an entire thickness of the material 24 is between the innermost periphery 43 of recess 34 and the straight-line boundary 40, and a portion of the thickness of material 26 is between the innermost periphery 43 and the straight-line boundary 40. The portions of materials 24 and 26 that are contained between the innermost periphery 43 and the straight-line boundary 40 may be referred to as being contained within the depth of the recess 34. In other embodiments different amounts of the thicknesses of materials 24, 26 and even 28, may be contained within the depth of the recess 34; as described in more detail below with reference to FIGS. 3-11.

One aspect of the invention is a recognition that charge coupling between the charge-storage structure 22 and the control gate may be improved by having the charge-blocking region 18 extending into a relatively deep recess (i.e., a recess of at least about 5 nm) within the control gate material 20. For instance, in some embodiments the memory cell 12 may be considered to comprise a first capacitive entity 44 representing capacitance between the control gate 14 and the charge-storage structure 16 during operation of the memory cell; and to comprise a second capacitive entity 46 representing capacitance between the charge-storage structure 16 and the channel material 30 during operation of the memory cell 12. The effectiveness of the control gate coupling with the charge-storage structure 22 may be expressed as a ratio of capacitance across capacitive entity 44 relative to capacitance across capacitive entity 46 (a so-called gate coupling ratio), with the larger gate coupling ratios indicating better control gate coupling. Improved control gate coupling may advantageously enable lower programming voltages for memory cells and/or other improvements.

Figure 2:
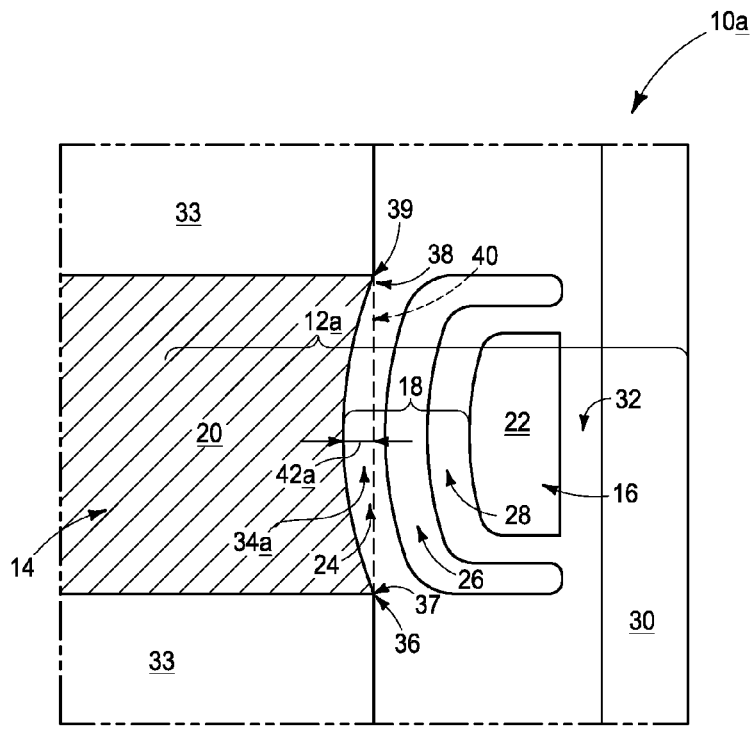
FIG. 2 is a diagrammatic cross-sectional side view of a prior art memory cell.

A construction 10a is shown in FIG. 2, and illustrates a prior art memory cell 12a in order to illustrate a contrast between the embodiment of FIG. 1 and the prior art. The memory cell 12a has a recess 34a with a depth 42a of less than 5 nm (i.e., shallower than the depth 42 of the example embodiment memory cell 12 of FIG. 1). The greater depth 42 of recess 34 of the example embodiment memory cell 12 (FIG. 1) as compared to the depth 42a of the recess 34a of the prior art memory cell 12a (FIG. 2) may enable the example embodiment memory cell 12 (FIG. 1) to have a higher gate coupling ratio as compared to the prior art memory cell 12a (FIG. 2). The higher gate coupling ratio may enable the example embodiment memory cell 12 (FIG. 1) to have improved performance characteristics (e.g., increased response time, lower power consumption, etc.) as compared to the prior art memory cell 12a (FIG. 2).

Figure 3:
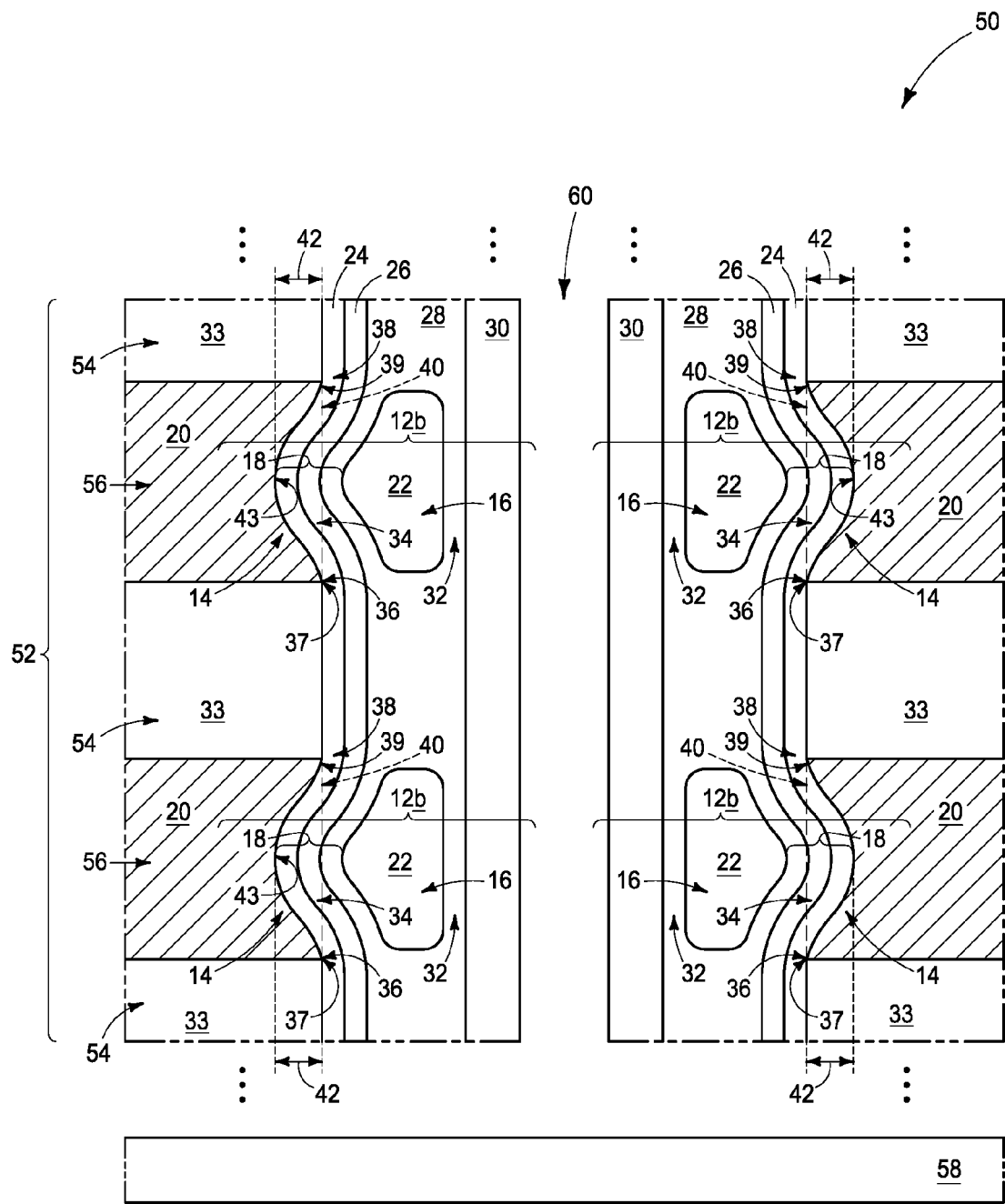
FIGS. 3-8 are diagrammatic cross-sectional side views of example integrated structures comprising vertically-stacked memory cells and recessed control gate levels.

Memory cells of the type described above with reference to FIG. 1 (i.e., the memory cell 12) may be incorporated into integrated structures, such as, for example, NAND memory arrays. FIG. 3 shows a region of an integrated structure 50 comprising a three-dimensional NAND memory array.

The integrated structure 50 comprises a stack 52 of alternating insulative levels 54 and conductive levels 56. The insulative levels 54 comprise the insulative material 33 (discussed above with reference to FIG. 1), and the conductive levels 56 comprise the conductive material 20 (discussed above with reference to FIG. 1).

The levels 54 and 56 may be of any suitable thicknesses; and may, for example, have thicknesses within a range of from about 10 nm to about 300 nm. In some applications, the insulative levels 54 may have thicknesses within a range of from about 10 nm to about 60 nm, and the conductive levels 56 may have thicknesses within a range of from about 20 nm to about 40 nm. In some embodiments the levels 54 and 56 may be about the same thicknesses as one another; and in other embodiments the levels 54 and 56 may be of different thicknesses relative to one another.

The stack 52 is supported by a base 58. A break is provided between the stack 52 and the base 58 to indicate that there may be additional materials and/or integrated circuit structures between the base and the stack 52.

The base 58 may comprise semiconductor material; and may, for example, comprise, consist essentially of, or consist of monocrystalline silicon. The base 58 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications the base 58 may correspond to a semiconductor substrate containing one or more materials associated with integrated circuit fabrication. Such materials may include, for example, one or more of refractory metal materials, barrier materials, diffusion materials, insulator materials, etc.

The integrated structure 50 includes a plurality of vertically-stacked memory cells 12b. Each memory cell includes a control gate 14 (a region of a conductive level 56), a charge-storage structure 16, and a charge-blocking region 18 between the control gate 14 and the charge-storage structure 16.

The charge-storage structures 16 comprise the charge-storage material 22 described above with reference to FIG. 1.

The charge-blocking regions 18 comprise three materials 24, 26 and 28; which may have the same compositions as described above with reference to FIG. 1. Accordingly, materials 24 and 28 may comprise, consist essentially of, or consist of silicon dioxide; and material 26 may comprise, consist essentially of, or consist of silicon nitride.

The charge-storage structures 16 are along the channel material 30, and are spaced from such channel material by gate dielectric material 32. The channel material 30 may comprise any of the compositions described above with reference to FIG. 1, and similarly the gate dielectric material 32 may comprise any of the compositions described above with reference to FIG. 1. In some embodiments the gate dielectric material 32 and the charge-blocking material 28 will both comprise silicon dioxide, and accordingly such materials are shown merging with one another in the embodiment of FIG. 3. In other embodiments the gate dielectric material 32 and the charge-blocking material 28 may comprise different compositions relative to one another.

In the illustrated embodiment of FIG. 3, a space (i.e., hollow) 60 extends downwardly through the channel material 30 and forms a so-called hollow channel configuration. In other embodiments, the channel material may be configured as a solid pillar. The space 60 may be left empty (i.e., may have air or other gas therein), or may be filled with solid or semisolid insulative material, such as, for example, silicon dioxide, silicon nitride, etc.

The vertically-stacked memory cells 12b may correspond to a vertical string (i.e., a vertical NAND string). The number of memory cells in each string may be determined by the number of conductive levels 56. The stack 52 may comprise any suitable number of conductive levels 56; including, for example, 8 levels, 16 levels, 32 levels, 64 levels, 128 levels, 256 levels, 512 levels, 1024 levels, etc.

The recesses 34 extend into the conductive levels 56. Each of the conductive levels has the first projection 36 beneath the recess 34, and the second projection 38 above the recess 34. The projections 36 and 38 have the outer edges 37 and 39, respectively. The straight-line boundaries 40 extend from the outer edges 37 to the outer edges 39, and depths of the recesses may be defined by horizontal distances 42 from the straight-line boundaries 40 to innermost peripheries 43 of the recesses. The straight-line boundaries 40 may be considered to correspond to outer peripheries of the conductive levels 56.

The recesses 34 may have depths of at least about 5 nm as described above with reference to FIG. 1; or may have any other suitable depths, including, for example, the various depth ranges described above with reference to FIG. 1. In the illustrated embodiment of FIG. 3, the charge-blocking materials 24 and 26 extend into the recesses (i.e., are between innermost peripheries of the recesses and the straight-line boundaries 40 of the outer peripheries of the recesses). A minor amount of the charge-blocking material 28 extends into the recesses 34, but the majority of the charge-blocking material 28 does not extend into the recesses 34. In some embodiments at least one of the charge-blocking materials (24/26/28) extends into the recesses 34, in some embodiments at least two of the three charge-blocking materials (24/26/28) extend into the recesses 34, and in some embodiments the two charge-blocking materials (24/26) extend into the recesses 34 and at least a portion of the charge-blocking material 28 extends into the recesses 34.

Figure 4:
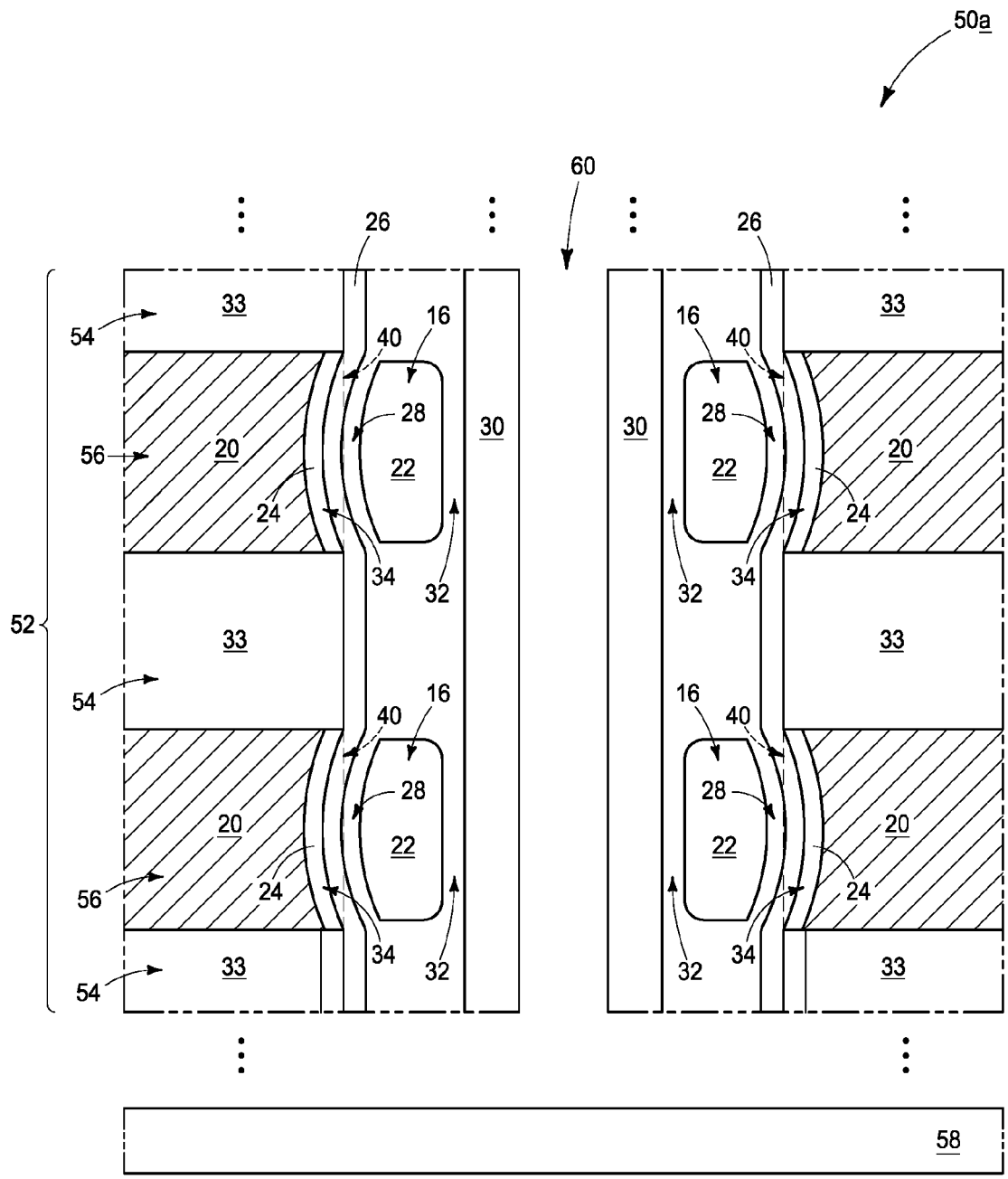

The embodiment of FIG. 3 shows the charge-blocking material 24 as a liner extending along the insulative material 33 of levels 54 and along the conductive material 20 of levels 56. Such may be a preferred embodiment if conductive material 20 comprises metal, in that the charge-blocking material 24 may then be deposited along such metal with atomic layer deposition (ALD), chemical vapor deposition (CVD), or any other suitable deposition methodology. However, in embodiments in which conductive material 20 of levels 56 comprises conductively-doped semiconductor material, it may be desired to simply grow the charge-blocking material 24 from a surface of the semiconductor material utilizing oxidative conditions. For instance, charge blocking material 24 may comprise silicon dioxide grown from a surface of conductively-doped silicon. FIG. 4 shows an integrated structure 50a which is similar to the structure 50 of FIG. 3, but which has the charge-blocking material 24 only along surfaces of conductive material 20 as would occur in embodiments in which the charge-blocking material is oxidatively grown from surfaces of conductive material 20.

Figure 5:
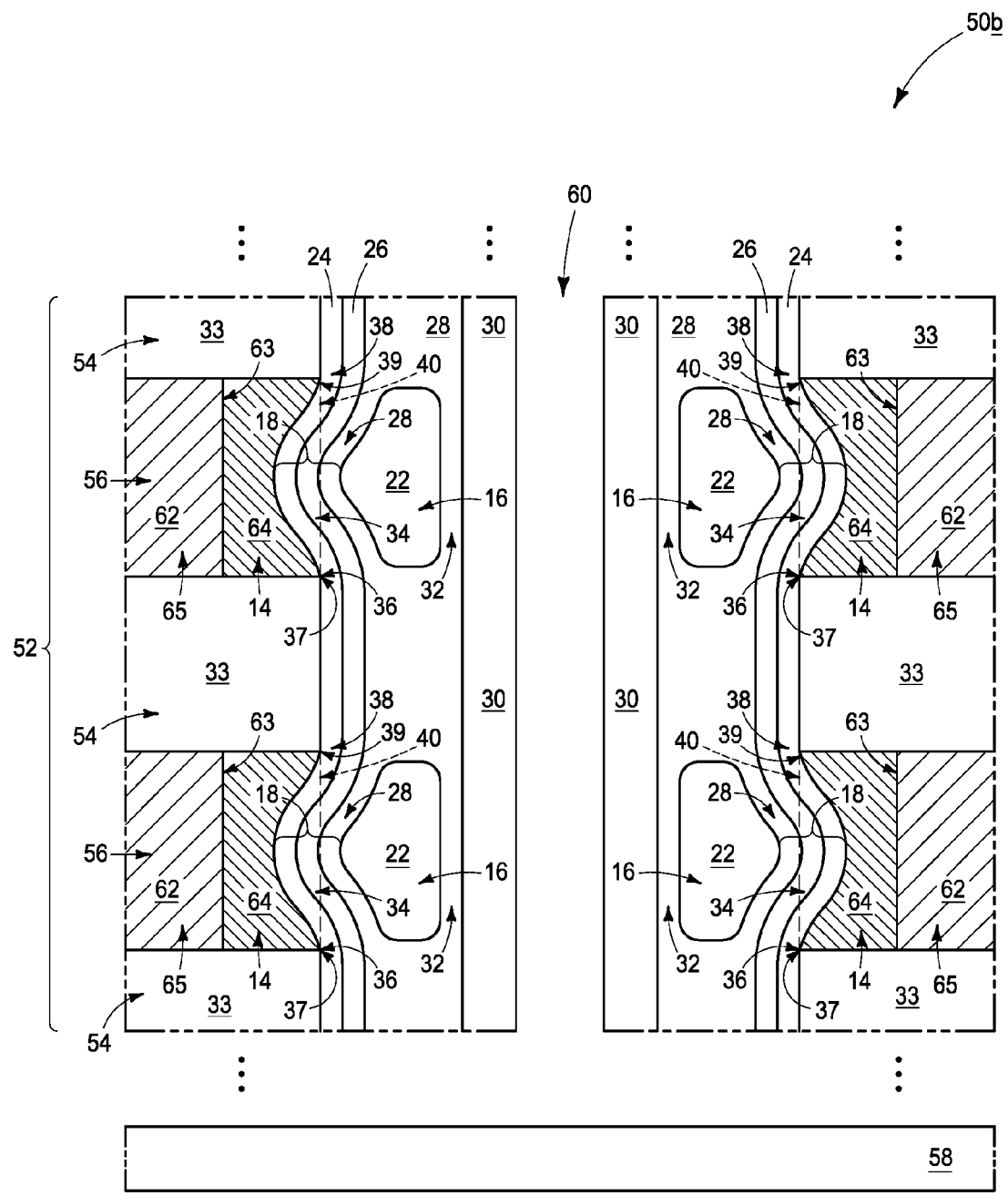

In some embodiments the conductive levels 56 may comprise two or more different conductive materials. For instance, FIG. 5 shows an integrated structure 50b in which the conductive levels 56 comprise first conductive material 62 configured as lines 65, and second conductive material 64 configured as caps along peripheral edges 63 of the lines 65. The second conductive material 64 is a different composition than the first conductive material 62. The first and second conductive materials 62 and 64 may comprise any suitable compositions, such as, for example, one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments both of the first and second conductive materials 62 and 64 may comprise metal, with the conductive material 64 comprising a different metal than the conductive material 62. In some embodiments, both of the conductive materials 62 and 64 may comprise conductively-doped semiconductor materials; with the conductive material 64 comprising different dopant then the conductive material 62 and/or comprising different semiconductor material than the conductive material 62. In some embodiments the conductive material 62 may comprise metal, and the conductive material 64 may comprise conductively-doped semiconductor material.

The integrated structure 50b of FIG. 5 comprises the charge-blocking regions 18 between charge-storage structures 16 and the second conductive material 64. In some embodiments the second conductive material 64 may comprise control gates 14 of the type described above with reference to FIG. 1. The charge-blocking regions are shown to comprise three materials 24, 26 and 28 of the type described above with reference to FIG. 1. The material 24 is a liner extending along the insulative levels 54 as well is along the conductive levels 56, analogously to the structure described above with reference to FIG. 3. In other embodiments the material 24 may be oxidatively formed only along a surface of the conductive material 64 of conductive levels 56 analogously to the embodiment described above with reference to FIG. 4.

The recesses 34 extend into the second conductive material 64 of conductive levels 56. The second conductive material 64 has a first projection 36 beneath the recess 34, and a second projection 38 above the recess 34 in the illustrated cross-section of FIG. 5. The projections 36 and 38 have the outer edges 37 and 39, respectively. The straight-line boundary 40 extends from the outer edge 37 to the outer edge 39; and a depth of a recess is defined to be a horizontal distance from the straight-line boundary 40 to an innermost periphery of the recess 34 (as described above with reference to FIG. 1). In some embodiments, the depths of the recesses 34 of FIG. 5 may be at least about 5 nanometers (nm), at least about 6 nm, at least about 8 nm, at least about 10 nm, etc. In some example embodiments the depths of the recesses 34 of FIG. 5 may be within a range of from about 5 nm to about 20 nm; within a range of from about 5 nm to about 15 nm; within a range of from about 6 nm to about 20 nm, etc.

The charge blocking region 18 extends into the recesses 34 of FIG. 5. Specifically, the charge-blocking materials 24 and 26 extend into the recesses 34, and a portion of the charge-blocking material 28 extends into such recesses in the shown embodiment.

Figure 6:
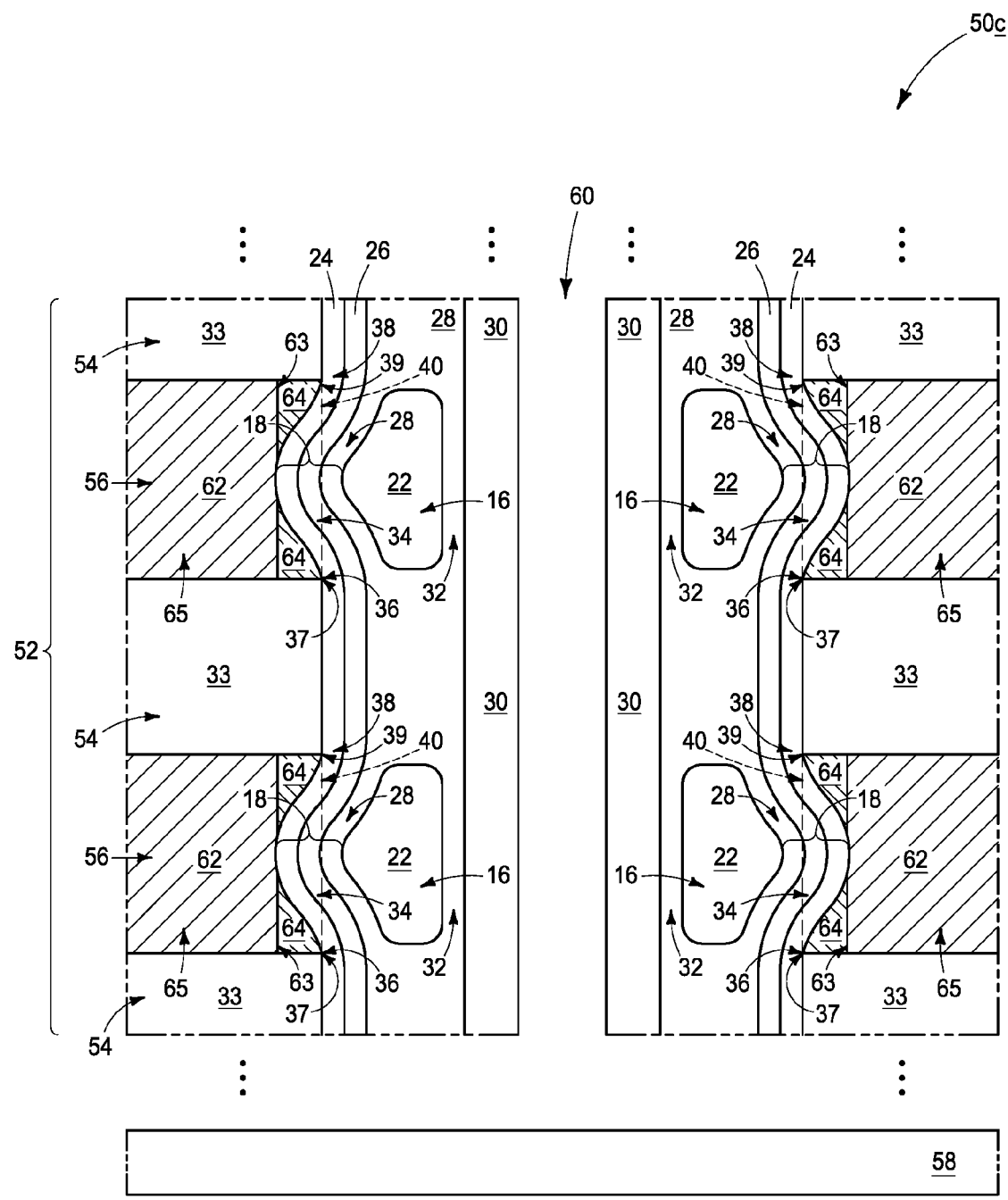

The embodiment of FIG. 5 has the recesses 34 extending partially into the second conductive material 64. In other embodiments, the recesses extend entirely through the second conductive material 64 to the first conductive material 62, as described with reference to an integrated structure 50c of FIG. 6. Specifically, the embodiment of FIG. 6 shows the recesses 34 extending through the second conductive material 64 to the peripheral edges 63 of the lines 65 of first conductive material 62. In other embodiments, the openings may extend past the peripheral edges 63 and into the conductive material 62.

Figure 7:
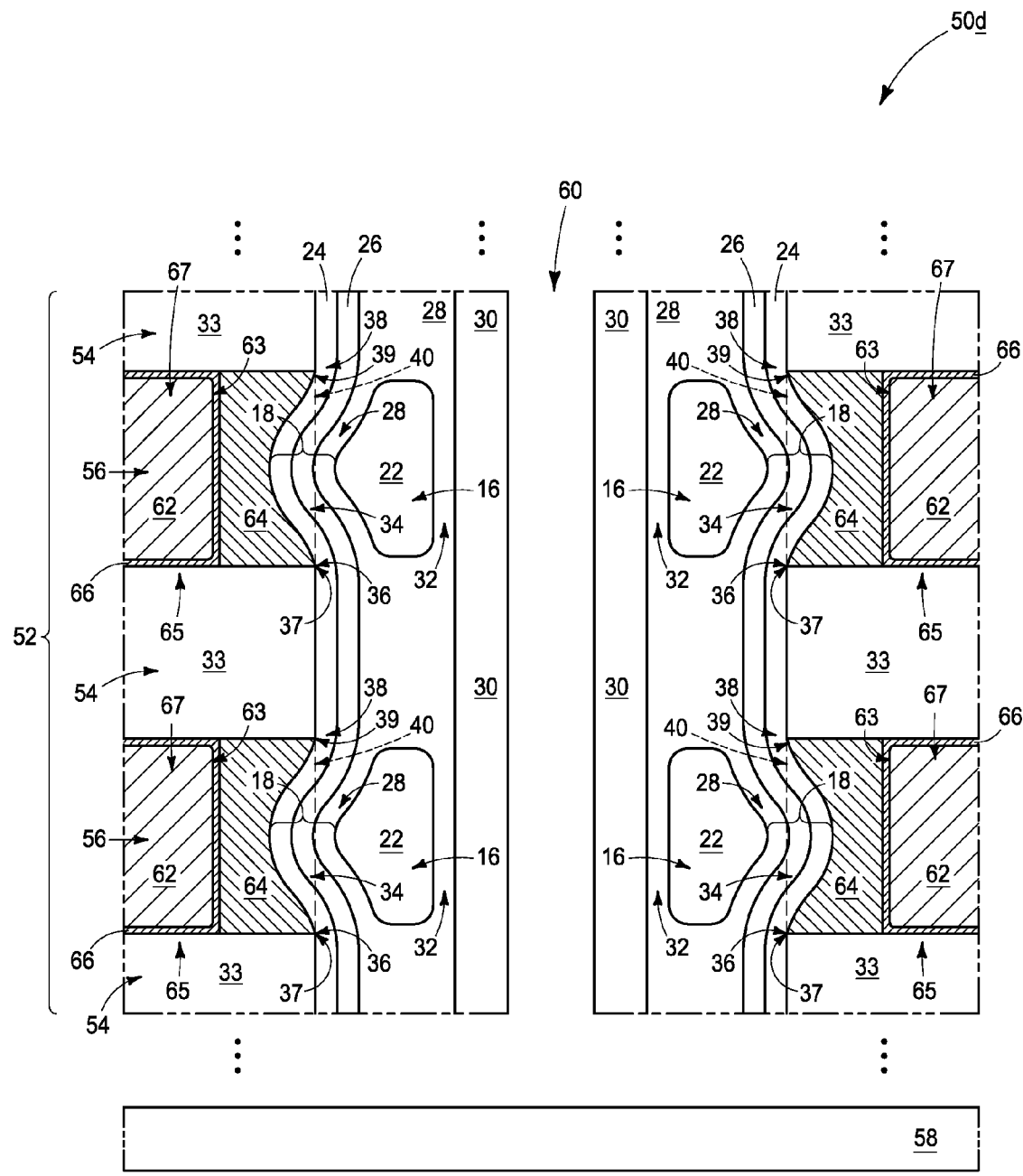
Figure 8:
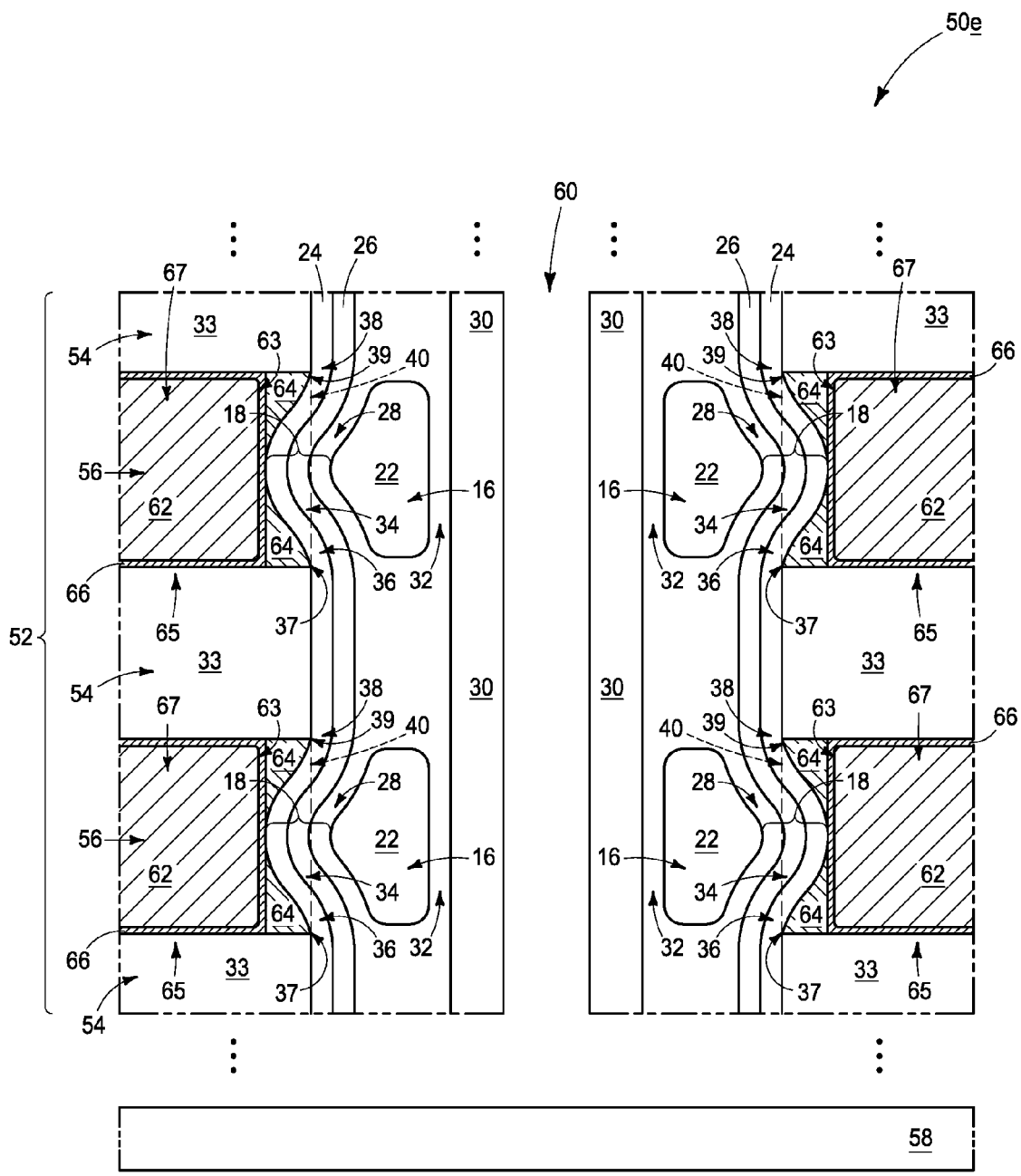
Figure 9:
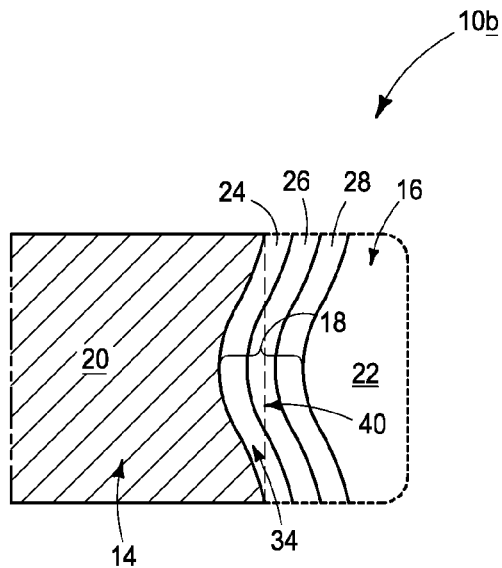
FIGS. 9-14 are diagrammatic cross-sectional side views of example memory cells.
Figure 10:
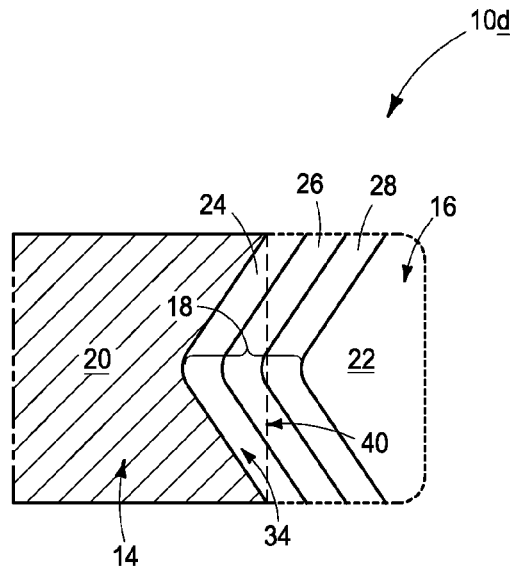
Figure 11:
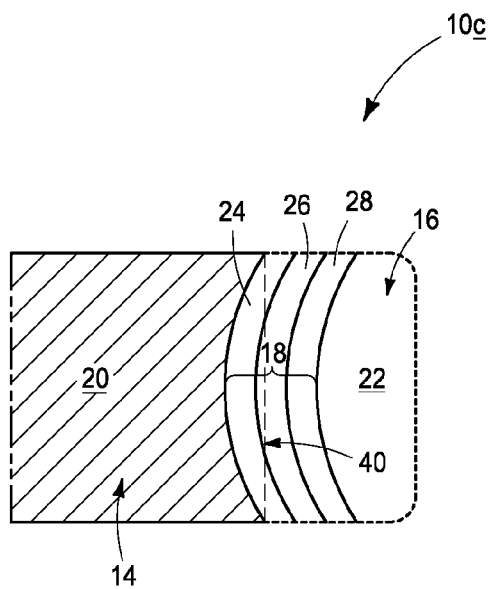
Figure 12:
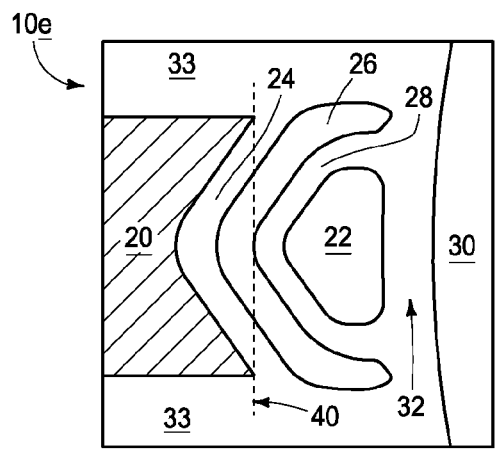
Figure 13:
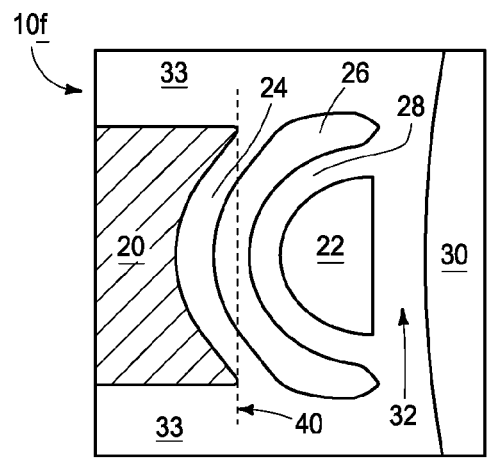
Figure 14:
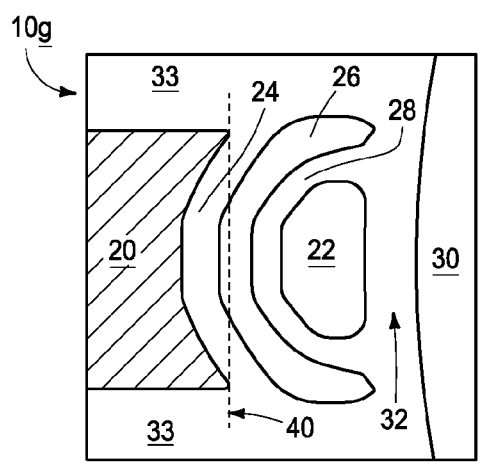

The embodiments of FIGS. 5 and 6 show the lines 65 comprising a single conductive material 62. In other embodiments the lines may comprise two or more different conductive materials. For instance, FIG. 7 shows an integrated structure 50d similar to the integrated structure 50b of FIG. 5 except that the lines 65 comprise the first conductive material 62 as a core 67, and comprise a third material 66 around the core 67. In some embodiments, the first material 62 may comprise metal, such as, for example, tungsten, titanium, etc.; and the third material 66 may comprise metal nitride, such as, for example, titanium nitride, tungsten nitride, etc. For instance, in some embodiments the first material 62 may comprise tungsten, and the third material 66 may comprise tungsten nitride.

The core 67 of material 62 comprises the outer peripheral edge 63. The second material 64 is along the outer peripheral edge 63, and is spaced from such outer peripheral edge by the third material 66. The second material 64 may comprise any suitable composition; and in some embodiment may comprise, consist essentially of, or consist of conductively doped semiconductor material (for instance, conductively-doped silicon).

The embodiment of FIG. 7 has the recesses 34 extending partially into the second material 64. In other embodiments the recesses 34 may extend entirely through the second material 64 as described with reference to an integrated structure 50e shown in FIG. 8. The structure 50e is analogous to the structure 50d of FIG. 7, except that the recesses 34 extend entirely through the second material 64 to a surface of the third material 66. In other embodiments (not shown) the recesses may extend into the third material 66, or even entirely through the third material 66 to contact the peripheral surface 63 of the core 67. In some embodiments the recesses 34 may extend partially into the first material 62 of the core 67.

The recesses 34 described herein have depths greater than about 5 nm to achieve the desired gate coupling ratio, and may have any suitable shape. For instance, the recesses may be conical, circularly convex, elliptically convex, etc. FIGS. 9-14 show constructions 10b-g illustrating a few examples of the numerous recess configurations that may be utilized in various embodiments. The structure 10e of FIG. 12 may be considered an example of a recess having an elliptically convex shape, the structure 10f of FIG. 13 may be considered an example of a recess having a circularly convex shape, and the structure 10g of FIG. 14 may be considered an example of a recess having a convex shape with a flat top (or flat innermost interior surface extending along control gate material 20).

The structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Some embodiments include an integrated structure comprising a vertical stack of alternating insulative levels and conductive levels. Recesses extend into the conductive levels. The conductive levels have projections above and below the recesses. The projections have outer edges. An outer periphery of an individual conductive level is defined by a straight-line boundary extending from the outer edge of the projection above the recess in the individual conductive level to the outer edge of the projection below the recess in the individual conductive level. A depth of the recess in the individual conductive level is defined as a horizontal distance from the straight-line boundary to an innermost periphery of the recess. The recesses have depths of at least about 5 nm. Charge-blocking regions extend within the recesses. Charge-storage structures are along the charge-blocking regions. Gate dielectric material is along the charge-storage structures. Channel material is along the gate dielectric material.

Some embodiments include an integrated structure comprising a vertical stack of alternating insulative levels and conductive levels. The conductive levels comprise first conductive material configured as lines, and second conductive material configured as caps along peripheral edges of the lines. The second conductive material is a different composition than the first conductive material. Recesses extend into the second conductive material of the conductive levels. Charge-blocking regions extend within the recesses. Charge-storage structures are along the charge-blocking regions. Gate dielectric material is along the charge-storage structures. Channel material is along the gate dielectric material.

Some embodiments include an integrated structure comprising a vertical stack of alternating insulative levels and conductive levels. The conductive levels comprise first conductive material configured as lines, and second conductive material configured as caps along peripheral edges of the lines. The second conductive material is a different composition than the first conductive material. Recesses extend into the second conductive material of the conductive levels. The conductive levels have projections above and below the recesses. The projections have outer edges. An outer periphery of an individual conductive level is defined by a straight-line boundary extending from the outer edge of the projection above the recess in the individual conductive level to the outer edge of the projection below the recess in the individual conductive level. A depth of the recess in the individual conductive level is defined as a horizontal distance from the straight-line boundary to an innermost periphery of the recess. The recesses have depths of at least about 5 nm, and the conductive levels have thicknesses within a range of from about 20 nm to about 40 nm. Charge-blocking regions extend within the recesses. The charge-blocking regions comprise three materials. Two of the three materials are between the innermost peripheries of the recesses and the straight line boundaries of the outer peripheries of the recesses. Charge-storage structures are along the charge-blocking regions. Gate dielectric material is along the charge-storage structures. Channel material is along the gate dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated structure, comprising:
 a vertical stack of alternating insulative levels and conductive levels;
 recesses extending into the conductive levels; the conductive levels having projections above and below the recesses, with the projections having outer edges; an outer periphery of an individual conductive level being defined by a straight-line boundary extending from the outer edge of the projection above the recess in the individual conductive level to the outer edge of the projection below the recess in the individual conductive level; a depth of the recess in the individual conductive level being defined as a horizontal distance from the straight-line boundary to an innermost periphery of the recess; the recesses having depths of at least about 5 nm;
 charge-blocking regions extending within the recesses;
 charge-storage structures along the charge-blocking regions;
 gate dielectric material along the charge-storage structures; and
 channel material along the gate dielectric material.

2. The integrated structure of claim 1 wherein the charge-blocking regions comprise three materials; and wherein two of the three materials are between the innermost peripheries of the recesses and the straight-line boundaries of the outer peripheries of the recesses.

3. The integrated structure of claim 2 wherein said two of the three materials have about the same thickness as one another.

4. The integrated structure of claim 2 wherein said two of the three materials have different thicknesses relative to one another.

5. The integrated structure of claim 2 wherein the three materials are a silicon nitride-containing material sandwiched between two silicon dioxide-containing materials.

6. The integrated structure of claim 2 wherein the recesses have depths within a range of from about 5 nm to about 20 nm.

7. The integrated structure of claim 1 wherein the conductive levels comprise conductively-doped semiconductor material.

8. The integrated structure of claim 1 wherein the conductive levels comprise conductively-doped silicon.

9. The integrated structure of claim 1 wherein the conductive levels comprise metal.

10. The integrated structure of claim 1 wherein the conductive levels comprise metal-containing lines and conductively-doped semiconductor material caps along peripheral edges of the metal-containing lines; the recesses extending into the conductively-doped semiconductor material caps.

11. The integrated structure of claim 10 wherein the recesses extend entirely through the conductively-doped semiconductor material caps.

12. The integrated structure of claim 10 wherein the recesses extend only partially through the conductively-doped semiconductor material caps.

13. The integrated structure of claim 1 wherein the insulative levels comprise silicon dioxide.

14. The integrated structure of claim 1 wherein the conductive levels have thicknesses within a range of from about 20 nm to about 40 nm.

15. The integrated structure of claim 1 wherein the recesses are convexly shaped.

16. The integrated structure of claim 1 wherein the recesses are elliptically convexly shaped.

17. The integrated structure of claim 1 wherein the recesses are circularly convexly shaped.

18. The integrated structure of claim 1 wherein the recesses are convexly shaped with flat innermost interior surfaces along the conductive levels.

19. An integrated structure, comprising:
 a vertical stack of alternating insulative levels and conductive levels; the conductive levels comprising first conductive material configured as lines, and second conductive material configured as caps along peripheral edges of the lines; the second conductive material being a different composition than the first conductive material;
 recesses extending into the second conductive material of the conductive levels;
 charge-blocking regions extending within the recesses;
 charge-storage structures along the charge-blocking regions;
 gate dielectric material along the charge-storage structures; and
 channel material along the gate dielectric material.

20. The integrated structure of claim 19 wherein the first and second conductive materials both comprise metal.

21. The integrated structure of claim 19 wherein the first and second conductive materials both comprise conductively-doped semiconductor material.

22. The integrated structure of claim 19 wherein the first conductive material comprises metal and the second conductive material comprises conductively-doped semiconductor material.

23. The integrated structure of claim 19 wherein the recesses extend entirely through the second conductive material of the conductive levels.

24. The integrated structure of claim 19 wherein the recesses extend only partially through the second conductive material of the conductive levels.

25. The integrated structure of claim 19 wherein the conductive levels have projections above and below the recesses, with the projections having outer edges; an outer periphery of an individual conductive level being defined by a straight-line boundary extending from the outer edge of the projection above the recess in the individual conductive level to the outer edge of the projection below the recess in the individual conductive level; a depth of the recess in the individual conductive level being defined as a horizontal distance from the straight-line boundary to an innermost periphery of the recess; the recesses having depths of at least about 5 nm.

26. An integrated structure, comprising:
a vertical stack of alternating insulative levels and conductive levels; the conductive levels comprising first conductive material configured as lines, and second conductive material configured as caps along peripheral edges of the lines; the second conductive material being a different composition than the first conductive material;
recesses extending into the second conductive material of the conductive levels; the conductive levels have projections above and below the recesses, with the projections having outer edges; an outer periphery of an individual conductive level being defined by a straight-line boundary extending from the outer edge of the projection above the recess in the individual conductive level to the outer edge of the projection below the recess in the individual conductive level; a depth of the recess in the individual conductive level being defined as a horizontal distance from the straight-line boundary to an innermost periphery of the recess; the recesses having depths of at least about 5 nm, and the conductive levels having thicknesses within a range of from about 20 nm to about 40 nm;
charge-blocking regions extending within the recesses; the charge-blocking regions comprising three materials; two of the three materials being between the innermost peripheries of the recesses and the straight line boundaries of the outer peripheries of the recesses;
charge-storage structures along the charge-blocking regions;
gate dielectric material along the charge-storage structures; and
channel material along the gate dielectric material.

27. The integrated structure of claim 26 wherein the three materials are a silicon nitride-containing material sandwiched between two silicon dioxide-containing materials.

28. The integrated structure of claim 26 wherein the first and second conductive materials both comprise metal.

29. The integrated structure of claim 26 wherein the first and second conductive materials both comprise conductively-doped semiconductor material.

30. The integrated structure of claim 26 wherein the first conductive material is a metal core, and comprising a metal nitride around the metal core; and wherein the second conductive material comprises conductively-doped semiconductor material and is spaced from the peripheral edge of the first conductive material by the metal nitride.

31. The integrated structure of claim 26 wherein the first conductive material is a tungsten core and comprising tungsten nitride around the tungsten core; and wherein the second conductive material comprises conductively-doped semiconductor material and is spaced from the peripheral edge of the first conductive material by the tungsten nitride.

32. The integrated structure of claim 26 wherein the recesses extend entirely through the second conductive material caps of the conductive levels.

33. The integrated structure of claim 26 wherein the recesses extend only partially through the second conductive material caps of the conductive levels.

* * * * *